(12) United States Patent
Hsu et al.

(10) Patent No.: US 8,766,416 B2
(45) Date of Patent: Jul. 1, 2014

(54) SEMICONDUCTOR PACKAGE AND FABRICATION METHOD THEREOF

(75) Inventors: Tsung-Hsien Hsu, Taichung Hsien (TW); Hao-Ju Fang, Taichung Hsien (TW); Hsin-Lung Chung, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 74 days.

(21) Appl. No.: 13/457,995

(22) Filed: Apr. 27, 2012

(65) Prior Publication Data
US 2013/0234337 A1 Sep. 12, 2013

(30) Foreign Application Priority Data
Mar. 8, 2012 (TW) .............................. 101107849 A

(51) Int. Cl.
*H01L 23/552* (2006.01)
*H01L 21/56* (2006.01)
*H01L 23/556* (2006.01)

(52) U.S. Cl.
CPC ............ *H01L 23/552* (2013.01); *H01L 23/556* (2013.01); *H01L 2924/3025* (2013.01)
USPC ........... 257/659; 257/660; 257/707; 257/709; 257/E21.502; 257/E23.114; 257/E23.116; 438/122; 438/109

(58) Field of Classification Search
CPC ................ H01L 23/552; H01L 23/556; H01L 2924/3025
USPC .................. 257/659, 660, 707, 709, E21.502, 257/E23.114, E23.116; 438/109, 122
See application file for complete search history.

(56) References Cited

U.S. PATENT DOCUMENTS

| | | | |
|---|---|---|---|
| 5,166,772 A | 11/1992 | Soldner et al. | |
| 8,093,690 B2 * | 1/2012 | Ko et al. | 257/660 |
| 2008/0174013 A1 * | 7/2008 | Yang et al. | 257/737 |
| 2011/0260301 A1 * | 10/2011 | Liao et al. | 257/659 |
| 2011/0298109 A1 * | 12/2011 | Pagaila et al. | 257/660 |

* cited by examiner

*Primary Examiner* — Dao H Nguyen
(74) *Attorney, Agent, or Firm* — Edwards Wildman Palmer LLP; Peter F. Corless; Steven M. Jensen

(57) ABSTRACT

A semiconductor package includes a substrate having opposite first and second surfaces and a ground layer therein. Further, the second surface has at least a recessed portion for exposing portions of the ground layer. The semiconductor package further includes a semiconductor chip disposed on the first surface of the substrate; an encapsulant formed on the first surface of the substrate for encapsulating the semiconductor chip; and a metal layer covering the encapsulant and the substrate and extending to the recessed portion for electrically connecting the ground layer. As such, the space for circuit layout is increased and the circuit layout flexibility is improved.

9 Claims, 3 Drawing Sheets

SEMICONDUCTOR PACKAGE AND FABRICATION METHOD THEREOF

CROSS-REFERENCES TO RELATED APPLICATIONS

This application claims under 35 U.S.C. §119(a) the benefit of Taiwanese Application No. 101107849, filed Mar. 8, 2012, the entire contents of which is incorporated herein by reference.

BACKGROUND OF THE INVENTION

1. Field of the Invention

The present invention relates to semiconductor packages and fabrication methods thereof, and more particularly, to a semiconductor package having an electromagnetic shielding function and a fabrication method thereof.

2. Description of Related Art

Along with the progress of semiconductor technologies, various package types have been developed for electronic products so as to improve the overall electrical performance. In particular, a lot of electronic products have an electromagnetic shielding function so as to shield the electronic products from electromagnetic interference (EMI).

U.S. Pat. No. 5,166,772 discloses a semiconductor package having an electromagnetic shielding function. Referring to FIGS. 1A and 1B, a semiconductor chip 11 is disposed on and electrically connected to a substrate 10. Then, a perforated metal shield 12 is disposed on the substrate 10 to cover the semiconductor chip 11. Thereafter, an encapsulant 13 is formed to encapsulate the metal shield 12 and the semiconductor chip 11. Therein, the metal shield 12 is grounded through at least a plated through hole (PTH) 14.

However, the plate through hole 14 occupies a lot of spaces of the substrate 10 and limits the layout of circuits on the substrate 10, thereby reducing the circuit layout flexibility.

Therefore, there is a need to provide a semiconductor package and a fabrication method thereof so as to save substrate spaces and increase the overall circuit layout flexibility.

SUMMARY OF THE INVENTION

In view of the above-described drawbacks, the present invention provides a semiconductor package, which comprises: a substrate having a first surface and a second surface opposite to the first surface, wherein a ground layer is formed in the substrate and partially exposed through at least a recessed portion of the second surface; a semiconductor chip disposed on the first surface of the substrate; an encapsulant formed on the first surface of the substrate for encapsulating the semiconductor chip; and a metal layer covering the encapsulant and the substrate and extending to the recessed portion for electrically connecting the ground layer.

In the above-described semiconductor package, the recessed portion can be located at a corner or an edge of the second surface.

In the above-described semiconductor package, the semiconductor chip can be electrically connected to the substrate through wire bonding or in a flip-chip manner.

The present invention further provides a fabrication method of a semiconductor package, which comprises the steps of: (A) providing a substrate having opposite first and second surfaces, allowing a semiconductor chip to be disposed on the first surface of the substrate, an encapsulant to be formed on the first surface of the substrate to encapsulate the semiconductor chip, and a ground layer to be formed in the substrate and partially exposed through at least a recessed portion formed in the second surface of the substrate; and (B) forming a metal layer for covering the encapsulant and the substrate and extending to the recessed portion for electrically connecting the ground layer.

In the above-described method, step (A) can further comprise the steps of: providing the substrate having the opposite first and second surfaces and the ground layer therein; forming the recessed portion in the second surface of the substrate for exposing portions of the ground layer; disposing the semiconductor chip on the first surface of the substrate; and forming the encapsulant on the first surface of the substrate to encapsulate the semiconductor chip.

In the above-described method, the recessed portion can be located at a corner or an edge of the second surface.

In the above-described method, the recessed portion can be formed by mechanical drilling or laser drilling.

In the above-described method, the semiconductor chip can be electrically connected to the substrate through wire bonding or in a flip-chip manner.

In the above-described method, the metal layer can be formed by sputtering.

In the above-described semiconductor package and method, the substrate can be a packaging substrate or a circuit board.

According to the present invention, at least a recessed portion is formed in the bottom surface of a substrate so as to expose the ground layer inside the substrate. As such, a metal layer can be formed to extend to the recessed portion for electrically connecting the ground layer. Therefore, the present invention dispenses with the plated through hole as required in the prior art so as to save substrate spaces and improve the circuit layout flexibility.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention. Meanwhile, terms such as 'in', 'inside', 'corner', 'edge', 'on', 'a' etc. are only used as a matter of descriptive convenience and not intended to have any other significance or provide limitations for the present invention.

FIGS. 2A to 2E are schematic cross-sectional views showing a fabrication method of a semiconductor package according to the present invention.

Figure 1A:
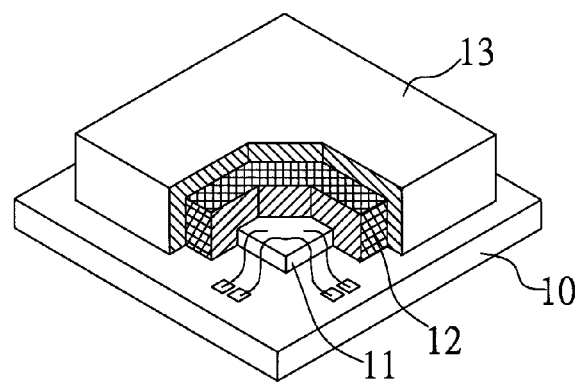
FIGS. 1A and 1B are schematic views showing a semiconductor package having an electromagnetic shielding function as disclosed by U.S. Pat. No. 5,166,772.
Figure 1B:
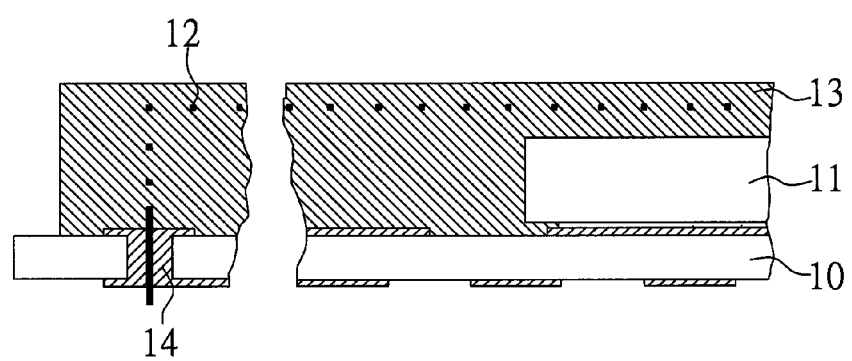
Figure 2A:
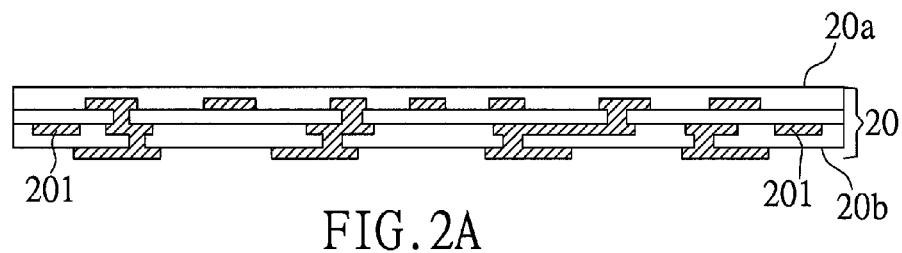
FIGS. 2A to 2E are schematic cross-sectional views showing a fabrication method of a semiconductor package according to the present invention.

Referring to FIG. 2A, a substrate 20 is provided, which has opposite first and second surfaces 20a, 20b and a ground layer 201 therein. The substrate 20 can be formed by laminating or stacking a plurality of dielectric layers and a plurality of circuit layers. Since the fabrication of the substrate is well known in the art, detailed description thereof is omitted herein. In addition, the substrate 20 can be a packaging substrate or a circuit board.

Figure 2B:
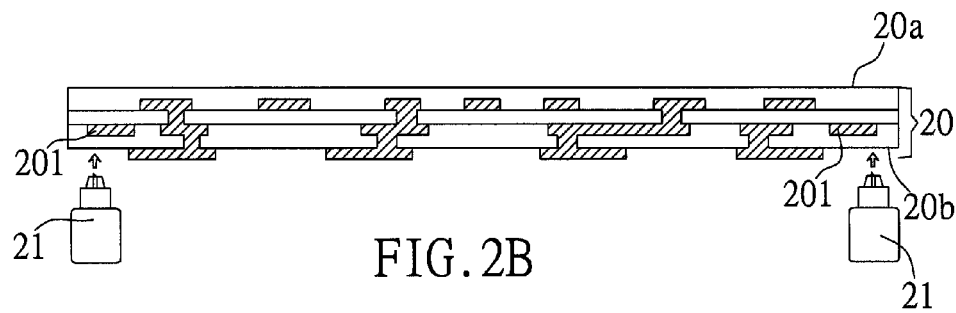
Figure 2C:
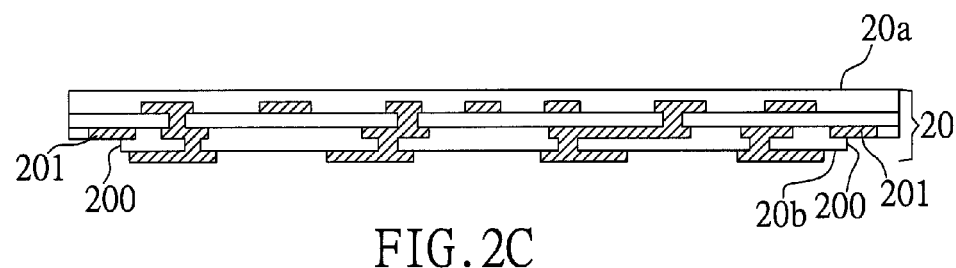

Referring to FIGS. 2B and 2C, a plurality of recessed portions 200 are formed in the second surface 20b of the substrate 20 by using a mechanical driller 21, thereby exposing portions of the ground layer 201. The recessed portions 200 can be located at corners or edges of the second surface 20b. Further, the recessed portions 200 can be formed by laser drilling. But the present invention is not limited thereto.

Figure 2D:
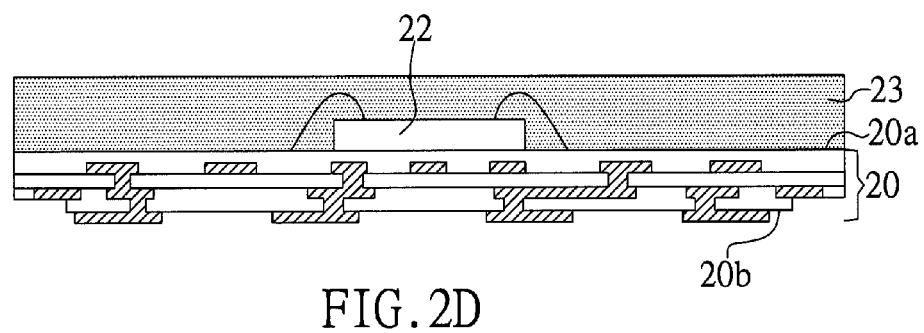

Referring to FIG. 2D, a semiconductor chip 22 is disposed on the first surface 20a of the substrate 20 and an encapsulant 23 is formed on the first surface 20a of the substrate 20 to encapsulate the semiconductor chip 22. The semiconductor chip 22 can be electrically connected to the substrate 20 through wire bonding or in a flip-chip manner.

Figure 2E:
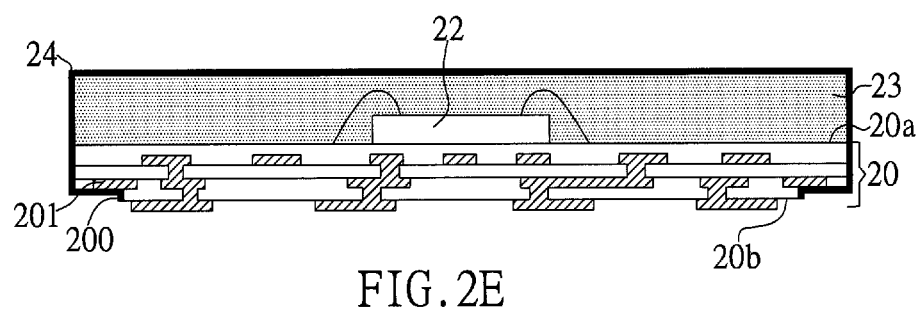

Referring to FIG. 2E, a metal layer 24 is formed to cover the encapsulant 23 and the substrate 20 and extend to the recessed portions 200 for electrically connecting the ground layer 201. The metal layer 24 can be formed through, but not limited to, a sputtering process.

It should be noted that the present invention can also form the recessed portions 200 after disposing the semiconductor chip 22 and forming the encapsulant 23 on the substrate 20.

The present invention further provides a semiconductor package, which has: a substrate 20 having opposite first and second surfaces 20a, 20b, wherein a ground layer 201 is formed in the substrate 20 and partially exposed through at least a recessed portion 200 of the second surface 20b; a semiconductor chip 22 disposed on the first surface 20a of the substrate 20; an encapsulant 23 formed on the first surface 20a of the substrate 20 for encapsulating the semiconductor chip 22; and a metal layer 24 covering the encapsulant 23 and the substrate 20 and extending to the recessed portion 200 for electrically connecting the ground layer 201.

In the above-described semiconductor package, the recessed portion 200 is located at a corner or an edge of the second surface 20b.

In the above-described semiconductor package, the semiconductor chip 22 is electrically connected to the substrate 20 through wire bonding or in a flip-chip manner.

In the above-described semiconductor package, the substrate 20 is a packaging substrate or a circuit board.

According to the present invention, at least a recessed portion is formed in the bottom surface of a substrate so as to expose the ground layer inside the substrate. As such, a metal layer can be formed to extend to the recessed portion for electrically connecting the ground layer. Therefore, the present invention dispenses with the plated through hole as required in the prior art so as to save substrate spaces and improve the circuit layout flexibility.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
    a substrate having a first surface and a second surface opposite to the first surface, wherein a ground layer is formed in the substrate and partially exposed through at least a recessed portion of the second surface, and an exposed surface of the ground layer is not coplanar with the second surface;
    a semiconductor chip disposed on the first surface of the substrate;
    an encapsulant formed on the first surface of the substrate for encapsulating the semiconductor chip; and
    a metal layer covering the encapsulant and the substrate and extending to the recessed portion for electrically connecting the ground layer.

2. The package of claim 1, wherein the recessed portion is located at a corner or an edge of the second surface.

3. The package of claim 1, wherein the substrate is a packaging substrate or a circuit board.

4. A fabrication method of a semiconductor package, comprising the steps of:
    (A) providing a substrate having opposite first and second surfaces, so as for a semiconductor chip to be disposed on the first surface of the substrate, an encapsulant to be disposed on the first surface of the substrate to encapsulate the semiconductor chip, and a ground layer to be formed in the substrate and partially exposed through at least a recessed portion formed in the second surface of the substrate, wherein an exposed surface of the ground layer is not coplanar with the second surface; and
    (B) forming a metal layer for covering the encapsulant and the substrate and extending to the recessed portion for electrically connecting the ground layer.

5. The method of claim 4, wherein step (A) comprises the steps of:
    providing the substrate having the opposite first and second surfaces and the ground layer therein;
    forming the recessed portion in the second surface of the substrate for exposing portions of the ground layer;
    disposing the semiconductor chip on the first surface of the substrate; and
    forming the encapsulant on the first surface of the substrate to encapsulate the semiconductor chip.

6. The method of claim 4, wherein the recessed portion is located at a corner or an edge of the second surface.

7. The method of claim 4, wherein the recessed portion is formed by mechanical drilling or laser drilling.

8. The method of claim 4, wherein the metal layer is formed by sputtering.

9. The method of claim 4, wherein the substrate is a packaging substrate or a circuit board.

\* \* \* \* \*